United States Patent [19]

McDonald et al.

[11] Patent Number: 4,833,411

[45] Date of Patent: May 23, 1989

[54] METHODS OF IMAGING SOLIDS BY NMR TECHNIQUES

[75] Inventors: Peter J. McDonald, Guildford; John J. Attard, South Shields; David G. Taylor, Guildford, all of England

[73] Assignee: National Research Development Corporation, London, England

[21] Appl. No.: 92,215

[22] Filed: Sep. 2, 1987

[30] Foreign Application Priority Data

Sep. 4, 1986 [GB] United Kingdom ............... 8621322

[51] Int. Cl.$^4$ ........................................... G01R 33/20
[52] U.S. Cl. ..................................... 324/309; 324/307
[58] Field of Search ............... 324/300, 307, 313, 312, 324/314, 309, 311, 304

[56] References Cited

U.S. PATENT DOCUMENTS

| | | | |
|---|---|---|---|
| 4,291,272 | 9/1981 | Hofer et al. | 324/304 |
| 4,613,949 | 9/1986 | Glover | 324/307 |
| 4,651,097 | 3/1987 | Iwaoka | 324/307 |
| 4,714,882 | 12/1987 | Nagayama | 324/307 |

FOREIGN PATENT DOCUMENTS

| | | |
|---|---|---|
| 0109633 | 5/1984 | European Pat. Off. . |
| 0215592 | 3/1987 | European Pat. Off. . |
| 0091008 | 9/1987 | European Pat. Off. . |

OTHER PUBLICATIONS

Physica 128B (1985) 79-80 S. Emid "Ultra High Resolution Multiple Quantum Spectroscopy in Solids".
Physica 128B (1985) 81-83 S. Emid and J. H. N. Creyghton, "High Resolution NMR Imaging in Solids".

*Primary Examiner*—Michael J. Tokar
*Attorney, Agent, or Firm*—Cushman, Darby & Cushman

[57] ABSTRACT

A sequence of a pair of r.f. pulses ($90_x°$ and $90_y°$) is applied to a solid being imaged with a time interval ($\tau$) after each pulse. A static magnetic field is maintained and a magnetic gradient field is superimposed in the said time intervals, the time integrals of the gradient magnitudes of the gradient fields being equal. A free induction solid echo signal is detected at the end of the second time interval. The sequence is repeated for different values of the time integral are to obtain a set of signals and Fourier transformations with respect to the said time integral are then carried out on the set to obtain one-dimensional information. Two-dimensional information can be obtained from a plurality of sets of signals, each set being obtained in the presence of an additional orthogonal gradient field of differing value for each set.

10 Claims, 4 Drawing Sheets

METHODS OF IMAGING SOLIDS BY NMR TECHNIQUES

This invention relates to methods of imaging solids by NMR techniques.

Various techniques are known by which NMR images of liquids, including liquid-like and biological material, can be obtained. However, little progress has been made with regard to the imaging of solids mainly due to the very much greater NMR spectral line widths observed in solids (10 to 100 kHz) as compared to liquids and biological systems (less than 10 Hz).

One suggested method involves measuring the free induction decay intensity at a fixed time following a 90° r.f. excitation pulse. The measurement is repeated in the presence of incremented magnetic field gradients and the resultant data set is Fourier transformed to obtain an image.

An intrinsic problem with imaging solids is the need to preserve coherent magnetisation following a 90° pulse for long enough to encode spatial information. When phase encoding, resolution is broadly determined by the product of maximum field gradient and encoding time. Benefit is clearly gained by increasing the latter, especially if the time can be increased sufficiently for maximum gradient fields to be significantly less than fields associated with the radio frequency irradiation. The gradients can then be left on throughout the pulses avoiding the need for very fast gradient switching.

A second more fundamental problem is the need to narrow broad spectral lines in order to resolve them separately in a magnetic field gradient. In imaging a requirement for effective line narrowing is that all spins experiencing a given applied magnetic field but different local fields acquire the same phase during the encoding period in the rotating frame.

The above-described method suffers from both technical and theoretical difficulties associated with these problems. Firstly, since the entire encoding of spatial information is accomplished within the spin-spin relaxation time $T_2$, large gradient strengths are required if good resolution is to be achieved in solids with broad lines. Secondly, the method does not provide effective line narrowing in experiments where finite gradient strengths are necessarily used. The resolution is limited to the physical distance needed to separate in frequency the spectral lines resulting from spins at different locations in the field gradient. In practice, the above method is therefore limited to mobile, liquid-like solids with relatively narrow NMR line widths.

It is an object of the invention to provide an improved method of imaging solids using NMR techniques.

According to the invention a method of providing NMR imaging information of solids comprises the steps of applying in the presence of a static magnetic field two successive resonant r.f. pulses, said pulses being each followed by time intervals in which a gradient magnetic field is superimposed on said static magnetic field and the time integrals of the gradient magnitudes of said gradient fields being equal, detecting the resultant free induction solid echo signal after said second time interval, repeating said steps with different values of said time integral to obtain a set of signals and then carrying out Fourier transformations with respect to the said time integral on the said set of signals.

The information that is provided from the Fourier transformation is one-dimensional, the relevant dimension being parallel to the direction of the gradient of the gradient magnetic field. If two-dimensional information is required then a plurality of sets of solid echo signals are required, each set being obtained with the application of an additional gradient magnetic field which is orthogonal to the aforesaid gradient magnetic field and is applied simultaneously therewith. The time integral of the gradient of the additional gradient field has a different value for each set of solid echo signals. Thus to obtain a rectangular two-dimensional image in a xy plane of $N \times M$ points a set of N values of time integral of gradient $g_x$ is applied for each of M different values of time integral of gradient $g_y$. The above method can be readily extended to provide three-dimensional imaging information.

In carrying out the invention in one embodiment both pulses are 90° pulses of relative r.f. phase quadrature and the gradient fields have their gradients in the same direction. The gradients in each interval may be constant in magnitude and of equal duration. They may be suppressed if desired during the application of the r.f. pulses, or alternatively to avoid rapid switching of gradient fields the gradient field may be maintained at a constant level from the instant of commencement of the first r.f. pulse to the end of the second time interval.

In carrying out the invention in another embodiment the first pulse is a 90° pulse and the second pulse is a 180° pulse and the gradient field during the second time interval is then of opposite direction to the gradient field during the first time interval.

Instead of maintaining a constant gradient field during the respective time intervals, which requires approximation to squarewave switching of the current, the gradient fields may be sinusoidal in shape with respect to time.

In order that the invention may be more fully understood reference will now be made to the accompanying drawings in which.

Figure 1:
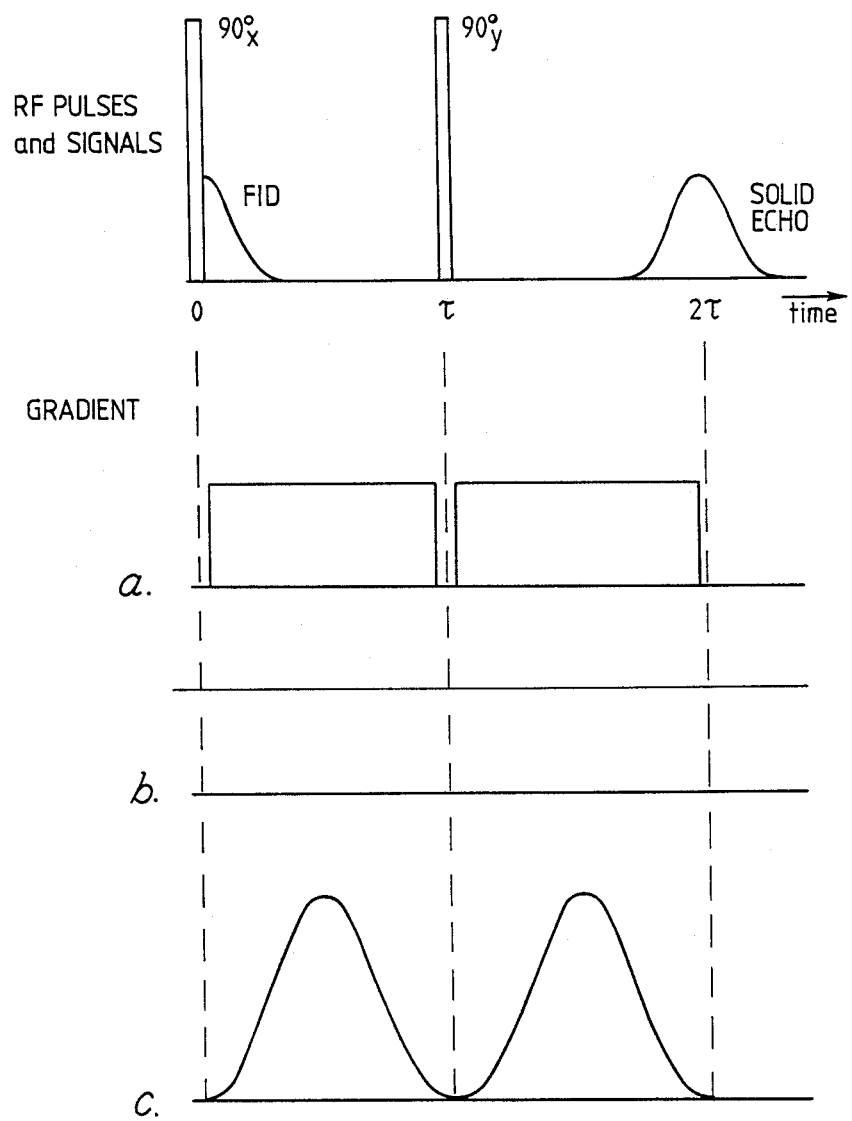
FIG. 1 shows an r.f. pulse sequence with alternative gradient fields.

Referring now to FIG. 1 there is shown therein an r.f. pulse sequence of the form $90_x\text{-}\tau\text{-}90_y$. This form comprises two 90° r.f. pulses with a time interval $\tau$ between them and the suffixes "x" and "y" denote that the r.f. phases of the pulses are in relative phase quadrature. When such a pulse sequence is applied to a sample of a solid positioned in a static magnetic field, an echo is generated after a time $2\tau$ from the first pulse. These echoes have the appearance of Hahn echoes which are seen in liquid state NMR and which are used in the imaging of liquids. However their origin is entirely different and their use in solids imaging likewise different. During pulse sequences leading to the observation of solid echoes, the effects of local dipolar fields are reversed for half the time. If relaxation due to non secular terms in the dipolar Hamiltonian is ignored, then at the echo centre zero time conditions prevail, all the spins having the same phase. Thus using echoes increases the time after which coherent magnetisation can be seen and results in effective line narrowing.

In the following calculation, the echo intensity for a system of dipolar coupled spin pairs in a field gradient is calculated and encoded with spatial information. From this a spin density profile is obtained.

A system consisting of pairs of spin ½ nuclei coupled via the dipolar Hamiltonian off resonance by a small magnetic field $B_z$ and subjected to the $90_x$-$\tau$-$90_y$ pulse sequence is considered first. Comparable results may be obtained for larger groups, such as three spin halves in an equilateral triangle. For simplicity, it is assumed that $B_z$ can be neglected during the intense radio frequency pulses. Using a density matrix formalism in the rotating frame and standard notation for spin operators, the magnetisation along $O_{x'}$ and $O_{y'}$ at time t after the second pulse itself time $\tau$ after the first, is proportional to:

$$<I_0(t+\tau)> = Tr[e^{-i(H_d+H_z)t}e^{iI_y\pi/2}e^{-i(H_d+H_z)\tau}e^{iI_x\pi/2}I_z \\ e^{-iI_x\pi/2}e^{i(H_d+H_z)\tau}e^{-iI_y\pi/2}e^{i(H_d+H_z)t}I_0] \quad (1)$$

where $$0 = X', Y' \quad (2)$$

$$H_d = A(3I_{1z}I_{2z} - \underline{I_1} \cdot \underline{I_2}) \quad (3)$$

$$H_z = -\gamma B_z(I_{1z} + I_{2z}) \quad (4)$$

$$A = -\gamma^2 \hbar (1 - 3\cos^2\theta)/2r^3 \quad (5)$$

$I_z$ is proportional to the initial density matrix and $\gamma$ is the gyromagnetic ratio. All other symbols have their usual meaning. Factors of $\hbar$ have been consistently dropped from the Hamiltonian definitions.

Introducing $M_o$ the equilibrium magnetisation and evaluating the traces (which is easiest using a basis of total spin states for which $H_d + H_z$ is diagonal) leads to $$<I_{x'}(t+\tau)> = M_o \cos(\gamma B_z \tau) \sin(\gamma B_z t) \cos(3A(\tau - t)/2) \quad (6)$$

$$<I_{y'}(t+\tau)> = M_o \cos(\gamma B_z \tau) \cos(\gamma B_z t) \cos(3A(\tau - t)/2) \quad (7)$$

Thus the components of magnetisation $M_{x'}$ and $M_{y'}$ along the x' and y' axes of the rotating frame at time $t = \tau$ after the second pulse have intensities given by:

$$M_{x'} = \tfrac{1}{2}M_o \sin(2\gamma B_z \tau) \quad (8)$$

$$M_{y'} = \tfrac{1}{2}M_o (1 + \cos(2\gamma B_z \tau)) \quad (9)$$

$M_{x'}$ and $M_{y'}$ are the observed central echo intensities when quadrature detection is employed. They are clearly a function of $B_z$, the off resonance field, but are independent of the dipolar coupling between spin pairs. If $B_z = gx$ is made a function of position x by applying a magnetic field gradient g then spatial frequencies are imposed on $M_{x'}$ and $M_{y'}$ which become functions of g. Defining $\rho(x)$ as the spin density at position x then $$M_{x'}(g) = \int_x \tfrac{1}{2} M_o \rho(x) \sin(2\gamma gx\tau) dx \quad (10)$$

$$M_{y'}(g) = \int_x \tfrac{1}{2} M_o \rho(x)(1 + \cos(2\gamma gx\tau)) dx \quad (11)$$

In order to remove the unity term from the integral for $M_{y'}(g)$ the more useful quantity $(M_{y'}(g) - \tfrac{1}{2} M_{y'}(O))$ is measured. The echo is recorded as a function of g and the resultant data set complex Fourier transformed with respect to gradient strength to give the spin density image.

$$\rho(x) = C \int_{g=-\infty}^{\infty} [(M_{y'}(g) - \tfrac{1}{2}M_{y'}(O))\cos(2\gamma gx\tau) + \\ M_{x'}(g)\sin(2\gamma gx\tau)]dg \quad (12)$$

where C is a constant.

To provide the magnetic field gradient g various alternative magnetic gradient fields can be provided and three of these are indicated at (a), (b) and (c) in FIG. 1. In variation (a) a constant gradient field is provided only during the post pulse time intervals and the field is switched off during the application of the r.f. pulses. However, if it is desired to avoid switching the gradient fields on and off variation (b) can be used in which the gradient field is left on at a constant value throughout the experiment. Yet again, in order to avoid square wave switching of magnetic fields, variation (a) can be replaced by variation (c) in which the gradient magnetic field amplitude has a sinuosidal profile and is zero while the r.f. pulses are applied.

Figure 2:
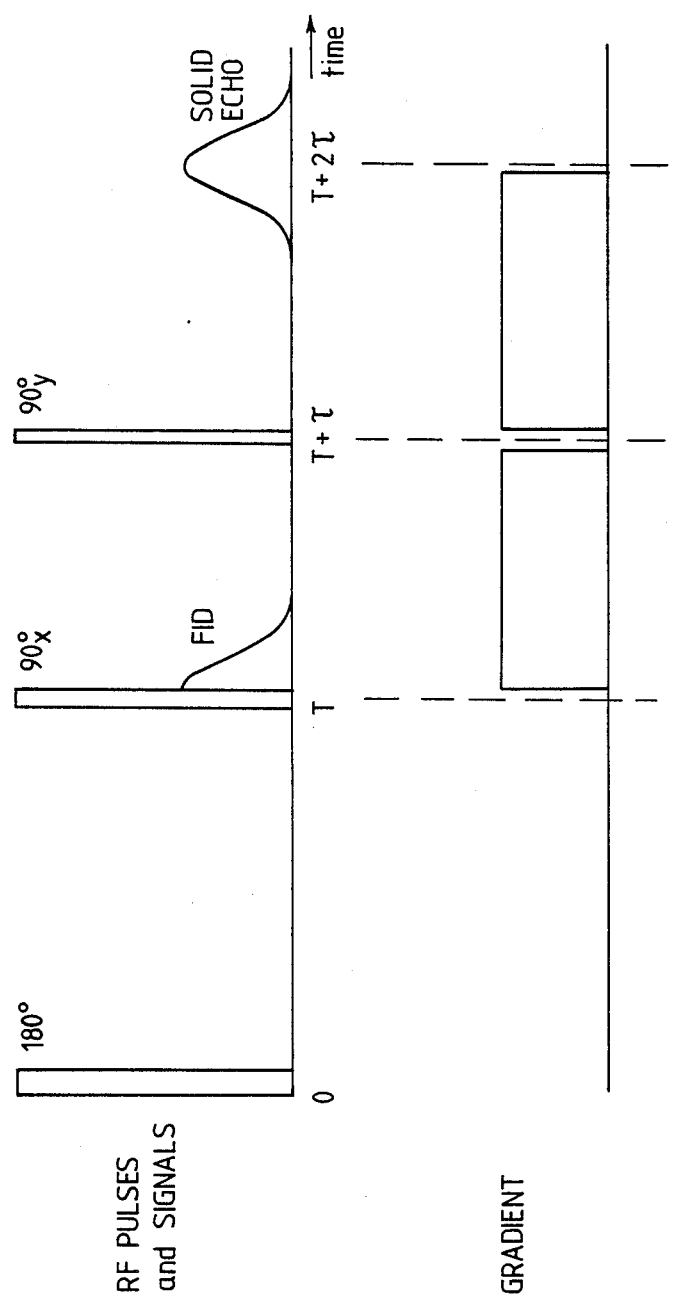
FIG. 2 shows a modification of the r.f. pulse sequence of FIG. 1.

If it is desired to obtain results which are weighted with respect to the spin-lattice relaxation time $T_1$, then for example the r.f. pulse sequence of FIG. 2 may be used. Here a preliminary 180° pulse is applied without a gradient field and at a time T before the application of the two-pulse sequence that is shown in FIG. 1.

Figure 3:
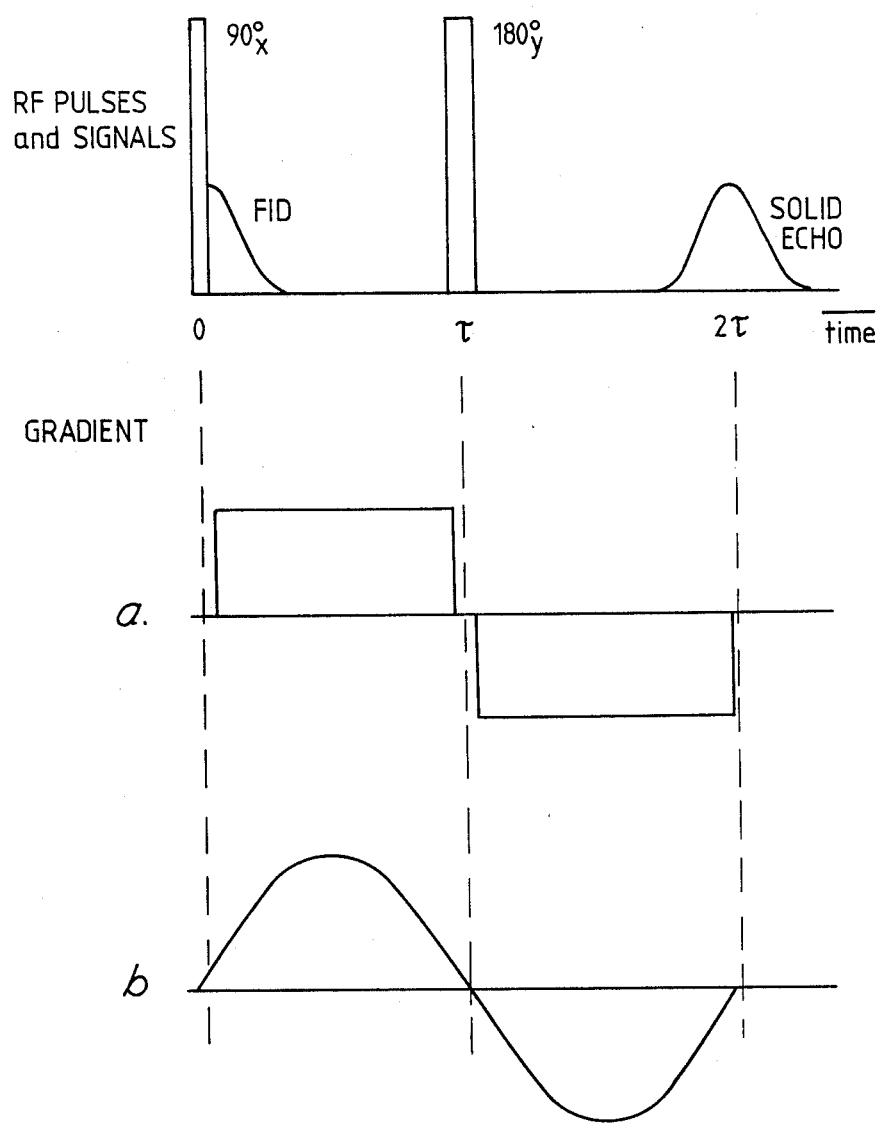
FIG. 3 shows another r.f. pulse sequence with alternative magnetic gradient fields.

As an alternative to the pulse sequence of FIG. 1 the sequence of FIG. 3 may be used. This sequence is a two-pulse sequence of the form $90°_x$-$\tau$-$180°_x$. In like manner to the FIG. 1 embodiments various magnetic gradient fields may be applied; however the direction of the magnetic field gradient after the second pulse must be reversed with respect to the direction of the gradient after the first pulse. The gradient fields may be constant in the post-pulse intervals as shown at (a). Alternatively the requirement for directional reversal of the gradients may be fulfilled by a full sine-wave as shown at (b). In the case of the pulse sequence of FIG. 3 equation (12), which gives the spin density image in the x direction, becomes modified as follows:

$$\rho(x) = C \int_{g=-\infty}^{\infty} [M_{x'}(g)\cos(2\gamma gx\tau) + M_{y'}(g)\sin(2\gamma gx\tau)]dg \quad (13)$$

One-dimensional proton (hydrogen) density profiles have been obtained for three different samples of powdered hexa-methyl-benzene. This sample has a short spin lattice relaxation time at room temperature which makes it easy to use and also has a short spin spin relaxation time of 40 $\mu$s giving it a 'true' solid character in the NMR sense.

Figure 4:
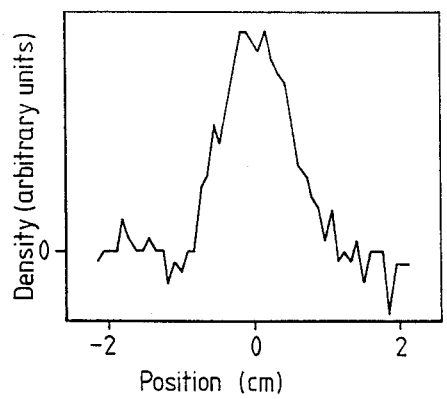
FIGS. 4, 5 and 6 show one dimensional spin density profiles for one, two and three blocks of hexa-methylbenzene respectively.
Figure 5:
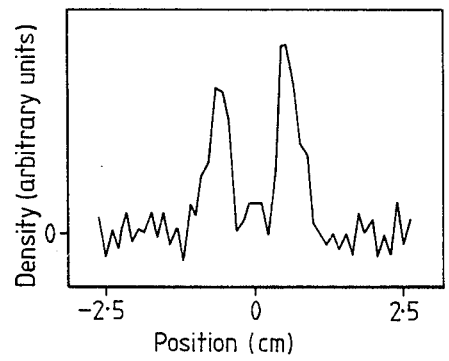
Figure 6:
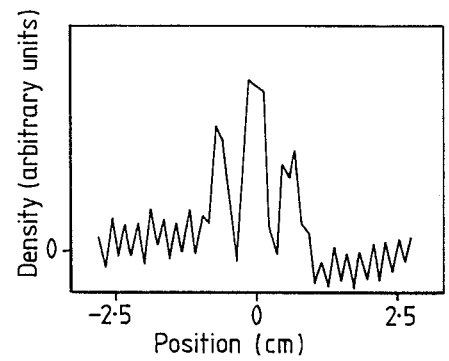

FIG. 4 shows the proton density along the axis of a glass test tube filled to a depth of 1.2 cm with hexa-methyl-benzene. A single peak in the profile plot corresponding to the sample is clearly seen. The pulse gap used to obtain this profile was 112 $\mu$s and the gradient was increased from $-6.3$ to $+6.3$ G/cm in equal steps of 0.26 G/cm. The 112 $\mu$s pulse gap gives a useful encoding time of 224 $\mu$s, more than five times $T_2$. FIG. 5 shows a profile obtained for two blocks of hexa-methyl-benzene both 0.5 cm long and separated by a 0.5 cm teflon spacer. FIG. 6 shows a profile for a sample consisting of three blocks of 0.25 cm separated by 0.25 cm. For the two and three block samples the gradients were the same as for the single block, but the pulse gaps were reduced to 92 and 86 μs respectively. Peaks in the profiles are again clearly seen corresponding to the blocks of hexa-methylbenzene. In all cases the peaks have their expected width. Glass and teflon do not contain hydrogen.

In all the profiles a delta function at $x=0$ arising from a d.c. offset in the measured magnetisation has been removed by averaging of the transformed data points immediately on either side of $x=0$. A rounding of the profiles towards the ends is attributed to the NMR coil being only just as long as the samples. At the coil ends there is a decrease in pulse field homogeneity to which solid echoes are particularly sensitive.

The maximum gradient field experienced by the ends of the longest of the samples was of order 4.7 G. The radio frequency field strength used to obtain the profiles was 10 G, somewhat greater, making it just about possible to leave the gradients static throughout the encoding sequence as was done. Finally, it is noted that the protons all occur in methyl triangles in hexamethylbenzene and not in pairs as described by the theory. The fact that profiles have been observed suggests that the theory may be more generally valid.

The results that have been obtained show that the solid echo method described above can be used as a technique to obtain NMR images of solids with dipolar broadened lines. Although the theory has been calculated for spin pairs it is extendable to more general systems and indeed the sample used for the demonstrations has the spins arranged in triangles. Non secular terms in the dipolar Hamiltonian have been ignored. They lead to a decrease in the echo intensity with increased pulse separation and place a limit on the maximum useful encoding time of a few $T_2$. Extensions to two and three dimensional imaging are straightforward.

The above described method has several advantages over other methods. Compared to multiple quantum NMR it is very much easier. Further, it does not have the sample range restrictions applicable to methods for dilute spin systems. Lastly it has an encoding period several times that of the method described in the introduction.

We claim:

1. A method of providing NMR imaging information of solids comprising the steps of:

(a) applying in the presence of a static magnetic field two successive resonant r.f. pulses, said pulses being each followed by a time interval in which a gradient magnetic field is superimposed on said static magnetic field and time integrals of gradient magnitudes of said gradient field are equal;
   (b) detecting a resultant free induction solid echo signal only at instants in time immediately after a second of said time intervals;
   (c) repeating said steps (a) and (b) with different values of said time integral to obtain a set of signals; and
   (d) then carrying out Fourier transformations with respect to said time integral on said set of signals.

2. The method as claimed in claim 1 in which at least the first of said r.f. pulses is a 90° pulse.

3. The method as claimed in claim 1 in which both pulses of a pair are 90° pulses of relative phase quadrature and respective gradient magnetic fields after each pulse have their gradients in the same direction.

4. The method as claimed in claim 1 in which a first of said r.f. pulses is a 90° pulse and a second of said rf pulses is a 180° pulse and a gradient magnetic field applied during the second time interval has its gradient in the opposite direction to the gradient magnetic field applied during the first time interval.

5. The method as claimed in claim 3 in which the gradient magnetic fields have the same amplitude during both said time intervals.

6. The method as claimed in claim 5 in which the gradient magnetic field is maintained at the same amplitude and direction during both said time intervals and while said pulses are applied.

7. The method as claimed in claim 1 in which the gradient magnetic fields are each of constant value.

8. The method as claimed in claim 1 in which the magnetic gradient fields are substantially sinusoidal with respect to time.

9. The method as claimed in claim 1 in which a preliminary 180° pulse is applied without a gradient field.

10. The method as claimed in claim 1 in which a plurality of sets of signals are obtained, each set being obtained with the application of an additional magnetic gradient field which is orthogonal to the aforesaid gradient magnetic fields and is applied simultaneously therewith, the time integral of the gradient of the said additional field having a different value for each set of signals.

* * * * *